US009801268B2

(12) United States Patent
Blodt

(10) Patent No.: US 9,801,268 B2
(45) Date of Patent: Oct. 24, 2017

(54) CIRCUIT BOARD EQUIPPED WITH A HIGH-FREQUENCY COMPONENT EMITTING INTERFERENCE WAVES

(71) Applicant: Endress + Hauser GmbH + Co. KG, Basel (CH)

(72) Inventor: Thomas Blodt, Basel (CH)

(73) Assignee: Endress + Hauser GmbH + Co. KG, Maulburg (DE)

( * ) Notice: Subject to any disclaimer, the term of this patent is extended or adjusted under 35 U.S.C. 154(b) by 172 days.

(21) Appl. No.: 14/413,431

(22) PCT Filed: Jun. 7, 2013

(86) PCT No.: PCT/EP2013/061808

§ 371 (c)(1),
(2) Date: Jan. 8, 2015

(87) PCT Pub. No.: WO2014/009069

PCT Pub. Date: Jan. 16, 2014

(65) Prior Publication Data

US 2015/0156861 A1 Jun. 4, 2015

(30) Foreign Application Priority Data

Jul. 10, 2012 (DE) ........................ 10 2012 106 174

(51) Int. Cl.
*H05K 7/00* (2006.01)
*H05K 1/02* (2006.01)
(Continued)

(52) U.S. Cl.
CPC ........... *H05K 1/024* (2013.01); *H05K 1/0227* (2013.01); *H05K 1/0231* (2013.01);
(Continued)

(58) Field of Classification Search
CPC ..... H01P 1/2016; H01P 3/023; H05K 1/0227; H05K 1/0231; H05K 1/0234; H05K 1/024;
(Continued)

(56) References Cited

U.S. PATENT DOCUMENTS 4,602,229 A * 7/1986 Yester, Jr. ........... H01P 1/20309 333/1
5,185,690 A * 2/1993 Miller ...................... H01G 4/20 174/72 B
(Continued)

FOREIGN PATENT DOCUMENTS

CN 1509132 A 6/2004
CN 101814651 A 8/2010
(Continued)

OTHER PUBLICATIONS

D.J. Masse, R.A. Pucel, "A Temperature-Stable Bandpass Filter Using Dielectric Resonators", Ratheon Res. Div. Massachusetts, 1972.
(Continued)

*Primary Examiner* — Yuriy Semenenko
(74) *Attorney, Agent, or Firm* — Bacon & Thomas, PLLC

(57) ABSTRACT

A circuit board comprising a circuit board ply, on which are provided a high-frequency component emitting electromagnetic interference waves during operation and at least one other component, especially another high-frequency component, wherein during operation an as low as possible degrading of the other component by interference waves is achieved. There is provided between the high-frequency component and the other component at least one dielectric barrier, which blocks propagation of high-frequency electromagnetic waves between the high-frequency component and the other component.

13 Claims, 5 Drawing Sheets

1 5 21 13 19 9b 15a T 15b 3 15 R 23 U 15c S 15d B 31 L 7

(51) Int. Cl.
*H01P 1/201* (2006.01)
*H01P 3/02* (2006.01)

(52) U.S. Cl.
CPC ......... *H05K 1/0234* (2013.01); *H05K 1/0243* (2013.01); *H01P 1/2016* (2013.01); *H01P 3/023* (2013.01); *H05K 2201/0187* (2013.01); *H05K 2201/09318* (2013.01)

(58) Field of Classification Search
CPC ......... H05K 1/0243; H05K 2201/0187; H05K 2201/09318
See application file for complete search history.

(56) References Cited

U.S. PATENT DOCUMENTS

| | | | |
|---|---|---|---|
| 5,714,919 A | 2/1998 | Satoh | |
| 6,194,981 B1 | 2/2001 | Henderson | |
| 6,266,016 B1 | 7/2001 | Bergstedt | |
| 7,518,472 B2 | 4/2009 | Mukaiyama | |
| 8,081,117 B2 | 12/2011 | Nagai | |
| 2003/0080826 A1 | 5/2003 | Chen | |
| 2005/0176380 A1 | 8/2005 | Okabe | |
| 2007/0176713 A1 | 8/2007 | Mukaiyama | |
| 2009/0117328 A1* | 5/2009 | Kawai | B32B 18/00 428/141 |
| 2009/0153433 A1* | 6/2009 | Nagai | H01Q 1/38 343/893 |
| 2012/0325523 A1 | 12/2012 | Kobayashi | |
| 2013/0062105 A1* | 3/2013 | Howard | H05K 1/0253 174/257 |
| 2014/0152520 A1 | 6/2014 | Toyao | |

FOREIGN PATENT DOCUMENTS

| | | | |
|---|---|---|---|
| EP | 0647975 | A2 | 4/1995 |
| EP | 1783855 | A1 | 5/2007 |
| EP | 1962377 | A1 | 8/2008 |
| JP | 58120301 | A | 7/1983 |
| WO | 2011111297 | A1 | 9/2011 |

OTHER PUBLICATIONS

P. Guillon, S. Mekerta, Y. Garault, “Microstop Bandstop Filter using a Dielectric Resonator”, IEEE Proc., vol. 128, Pt. H, No. 3, Jun. 1981.

S. Verdeyme, Pierre Guillon, “Scattering Matrix of Dielectric Resonator Coupled with Two Microstrip Lines”, IEEE Transactions on Microwave Theory and Techniques, vol. 39, No. 3, Mar. 1991, New York.

Yasutoshi Komatsu, Yoshikazu Murakami, “Coupling Coefficient Between Microstrip Line and Dielectric Resonator”, IEEE Transactions on Microwave Theory and Techniques, Jan. 1983, New York.

English Translation of the International Preliminary Report on Patentability, WIPO, Geneva, CH, dated Jan. 22, 2015.

International Search Report, EPO, The Netherlands, dated Jan. 28, 2014.

German Search Report, Munich, Germany, dated May 31, 2013.

* cited by examiner 1
3
31
5
7
9b
13
21
19
23
15
15a
15b
15c
15d
R
S
T
U
B
L

CIRCUIT BOARD EQUIPPED WITH A HIGH-FREQUENCY COMPONENT EMITTING INTERFERENCE WAVES

TECHNICAL FIELD

The invention relates to a circuit board with a circuit board ply, on which are provided a high-frequency component emitting high-frequency electromagnetic interference waves during operation and at least one other component, especially also a high-frequency component.

BACKGROUND DISCUSSION

Such circuit boards are widely applied in high-frequency technology, especially in a large number of electronic devices used in high-frequency technology. The terminology, high-frequency, refers here to frequencies in the range of 3 MHz to 300 GHz. High-frequency components are circuits or circuit parts, which have at least one circuit component working at these frequencies.

An example of such devices are fill level measuring devices working with microwaves according to the pulse radar method. These serve for measuring fill level of a fill substance located in a container. They have arranged above the fill substance an antenna, via which in measurement operation, periodically, short microwave pulses of a predetermined transmission frequency are sent toward the fill substance, and their signal components reflected on the surface of the fill substance received after a travel time dependent on the fill level. These fill level measuring devices have regularly a high-frequency module, with which the transmission signals are produced and their reflected signal components conditioned and processed for travel-time measurement. The high-frequency module includes, for this, a number of high-frequency components, such as, for example, a transmitting circuit for producing the transmission signal, a receiving circuit for receiving reflected signal components and processing circuits for determining travel time.

High-frequency components, as a rule, emit high-frequency electromagnetic interference waves during operation. Conversely, however, exactly high-frequency components are frequently very sensitive to high-frequency interference.

Accordingly, it is exactly in high-frequency technology especially important to suppress interfering effects of high-frequency components arranged on one and the same circuit board on one another.

In such case, it is to be noted that high-frequency electromagnetic interference fields are, as a rule, capable of propagation both above the circuit board as well as also within individual plies of circuit boards.

Various solutions are known from the state of the art for reducing mutual degrading of high-frequency components arranged on one and the same circuit board.

Thus, for reducing mutual influencing of neighboring components, an as great as possible spatial separation between the components can be provided. This is, however, only possible when sufficient space is available on the circuit board.

Furthermore, there can be inserted between neighboring components a comparatively broad copper conductive trace on a circuit board ply, in order to effect a blocking of wave fractions propagating above the circuit board ply. For blocking wave fractions propagating within the circuit board ply, there can be provided along the copper conductive trace vias, which connect the copper conductive trace conductively with a copper ply located under the circuit board ply. In such case, a section of the circuit board ply located between two vias acts as a metal hollow conductor, whose cut-off frequency is adjustable by its dimensioning and the dielectric properties of the circuit board ply. Correspondingly, interference signals with frequencies lying under the cut-off frequency are not capable of propagation in the hollow conductor.

Likewise it is known to shield the components from one another by solid metal webs applied on the circuit board or by soldered on, sheet metal pieces. Solid metal webs effect a high-quality interference suppression. They have, however, the disadvantage that they are costly and must in the case of each change of circuit board layout be taken into consideration, respectively, in most cases, also changed in position.

Moreover, described in German Patent, DE 10 2010 061 714 A1 is the placement on a portion of the circuit board of an at least sectionally metallized covering, which shields the therebeneath located portion from electromagnetic interference fields, which the circuit board upper side is exposed to, and suppresses an emission of electromagnetic interferences.

Additionally, the interior of the covering can be filled with a conductive foam, in which multiple reflections of electromagnetic waves take place, which lead to an undirected attenuation of the interference waves.

In such case, however, a minimum distance of a fourth-wavelength must be maintained between the foam and the neighboring high-frequency lines.

Also, these covers are costly and the geometry of the covering must be taken into consideration in the case of each change of circuit board layout, respectively, in most cases, the geometry must also be changed.

SUMMARY OF THE INVENTION

It is an object of the invention to provide a circuit board, which has a circuit board ply, on which are provided a high-frequency component emitting high-frequency electromagnetic interference waves during operation and at least one other component, especially another high-frequency component, in the case of which during operation an as low as possible degrading of the component from interference waves occurs.

The invention resides in a circuit board comprising a circuit board ply, on which are provided a high-frequency component emitting high-frequency electromagnetic interference waves during operation and at least one other component, especially another high-frequency component, wherein there is provided between the high-frequency component and the other component at least one dielectric barrier, which blocks propagation of high-frequency electromagnetic interference waves between the high-frequency component and the other component.

In a first variant of the invention, at least one dielectric barrier is a dielectric body mounted on an upper side of the circuit board ply, especially a dielectric core of a component applied on a metal conductive trace on the upper side of the circuit board ply, especially a component in the form of a resistor or a capacitor.

In a second variant of the invention, at least one dielectric barrier is a dielectric wave conductor arrangement arranged in the circuit board ply.

In a preferred embodiment of the second variant, the dielectric wave conductor arrangement includes at least one wave conductor segment extending transversely to a propagation direction of the interference waves.

In a preferred further development of the second variant, the wave conductor arrangement includes wave conductor segments connected with one another via an intersection, of which two are connected with one another in a straight line across the intersection and extend transversely to a propagation direction of the interference waves, and two are connected with one another in a straight line across the intersection and extend parallel to the propagation direction of the interference waves.

Another further development of the preferred further development provides that interference waves coming during operation into the wave conductor arrangement via the wave conductor segment extending parallel to the propagation direction of the interference waves and facing the high-frequency component are divided at the intersection into wave portions propagating in the remaining wave conductor segments, these wave portions are reflected at the ends of the wave conductor segments, and the wave conductor segments have predetermined lengths predetermined as a function of a main-frequency of the interference waves, such that wave portions of entering interference waves of the main-frequency destructively superimpose in the wave conductor arrangement with wave portions reflected at the ends of the wave conductor segments.

For this, the wave conductor arrangement is preferably embodied in such a manner that the wave conductor segments extending transversely to the propagation direction of the interference waves have a length, which corresponds to a half wavelength of the interference waves having the main-frequency in these wave conductor segments, and the wave conductor segments extending parallel to the propagation direction of the interference waves have a length, which corresponds to a fourth of the wavelength of the interference waves having the main-frequency in these wave conductor segments.

Moreover, the wave conductor arrangement according to the preferred further development includes facing the high-frequency component preferably an input, which opens into the wave conductor segment facing the high-frequency component and extending parallel to the propagation direction of the interference waves.

Preferably, the wave conductor segments connected in a straight line with the input in the wave conductor arrangement according to the preferred further development have a smaller impedance than the remaining wave conductor segments.

In a preferred embodiment of the circuit board according to the second variant, the wave conductor arrangement is formed by a region of the circuit board ply, in which a metallizing is applied both on the upper side and on an underside of the circuit board ply, the metallizings have a structuring formed by cutouts in the metallizing, and the structuring in cooperation with the regions of the circuit board ply enclosed therebetween forms the wave conductor arrangement.

In a first form of this preferred embodiment, the metallizings are metal surfaces separated spatially from one another.

In an alternative form of this preferred embodiment the metal surfaces of one of the metallizings, especially the metal surfaces of the metallizing provided on the underside of the circuit board ply, are connected conductively with one another via bridges applied on the circuit board ply outside of the wave conductor arrangement.

In an additional embodiment of the preferred embodiment of the circuit board, the input of the wave conductor arrangement is formed by cutouts in the metallizing on the underside of the circuit board ply.

In a further development of the invention, the invention resides in a circuit board according to the preferred further development of the second variant, in the case of which one of the wave conductor segments extending transversely to the propagation direction of the interference waves and the wave conductor segment extending parallel to propagation direction on the side of the intersection facing away from the high-frequency component are embodied in such a manner that they have a slightly smaller length on their upper side than on their underside.

In a preferred embodiment, for this, the wave conductor segment extending transversely to the propagation direction of the interference waves and the wave conductor segment extending parallel to propagation direction on the side of the intersection facing away from the high-frequency component have on their underside, in each case, a circularly shaped termination.

In a further development of the preferred embodiment, vias are provided, which connect the metallizing on the upper side of the circuit board ply conductively with the metallizing located therebeneath on the underside of the circuit board ply.

In a further development of the latter further development, regions free of vias are provided on the sides of the wave conductor segments facing the other component and extending transversely to the propagation direction of the interference waves, directly bordering on these wave conductor segments.

In a further development of the preferred embodiment of the second variant, a metallizing free region is provided on the underside of the circuit board ply between the high-frequency component and the wave conductor arrangement.

In a preferred embodiment of the circuit boards of the invention, there is provided under the circuit board ply another circuit board ply of a material attenuating high-frequency electromagnetic waves, especially a material composed of epoxy resin soaked, glass fiber mats.

BRIEF DESCRIPTION OF THE DRAWINGS

The invention and its advantages will now be explained in greater detail based on the figures of the drawing, in which an example of an embodiment of a first variant and two examples of embodiments of a second variant of the invention are presented; equal parts are provided in the figures with equal reference characters. The figures of the drawing show as follows.

DETAILED DISCUSSION IN CONJUNCTION WITH THE DRAWINGS

Figure 1:
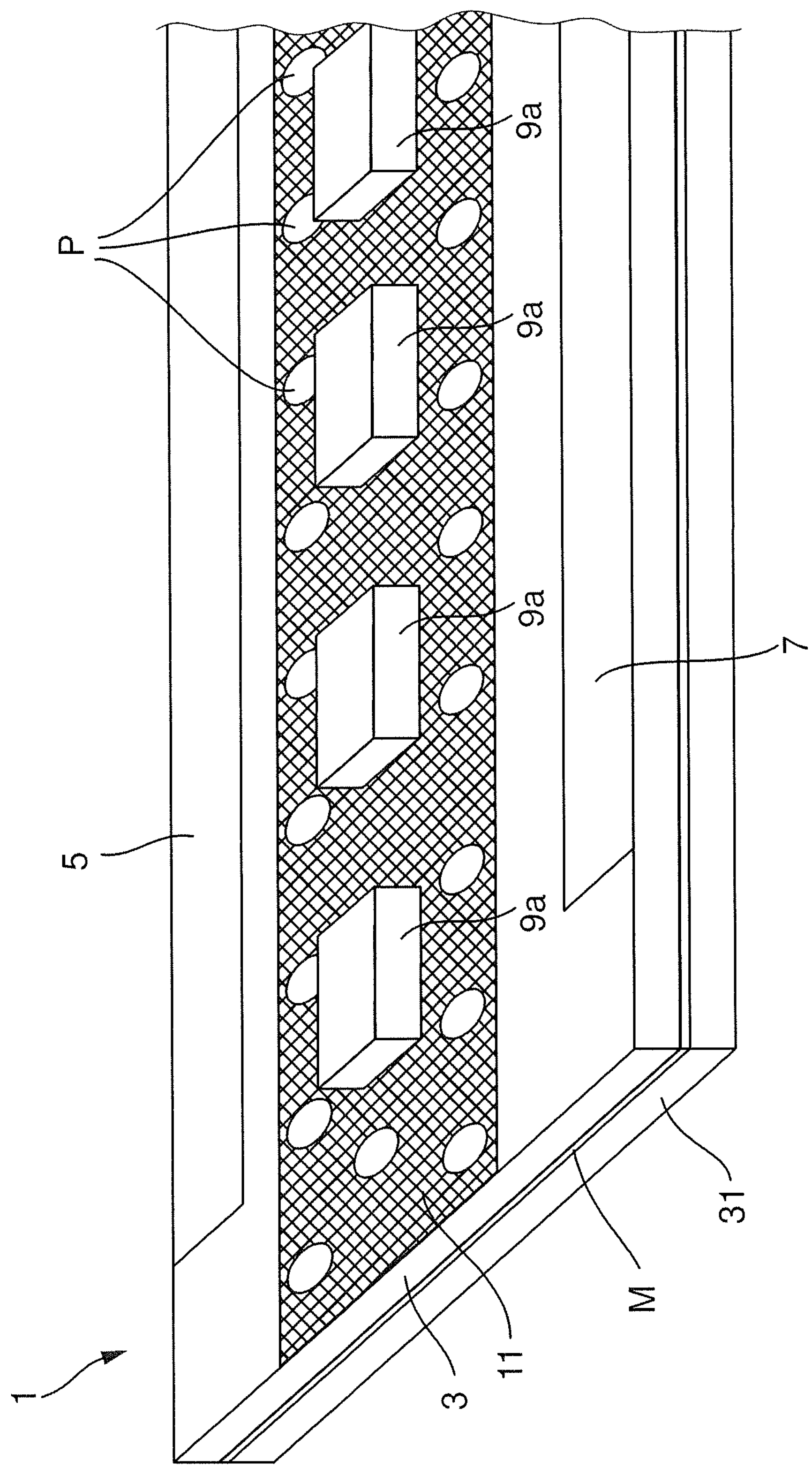
FIG. 1 is a circuit board, on which dielectric barriers are arranged between a high-frequency component and an other component.
Figure 2:
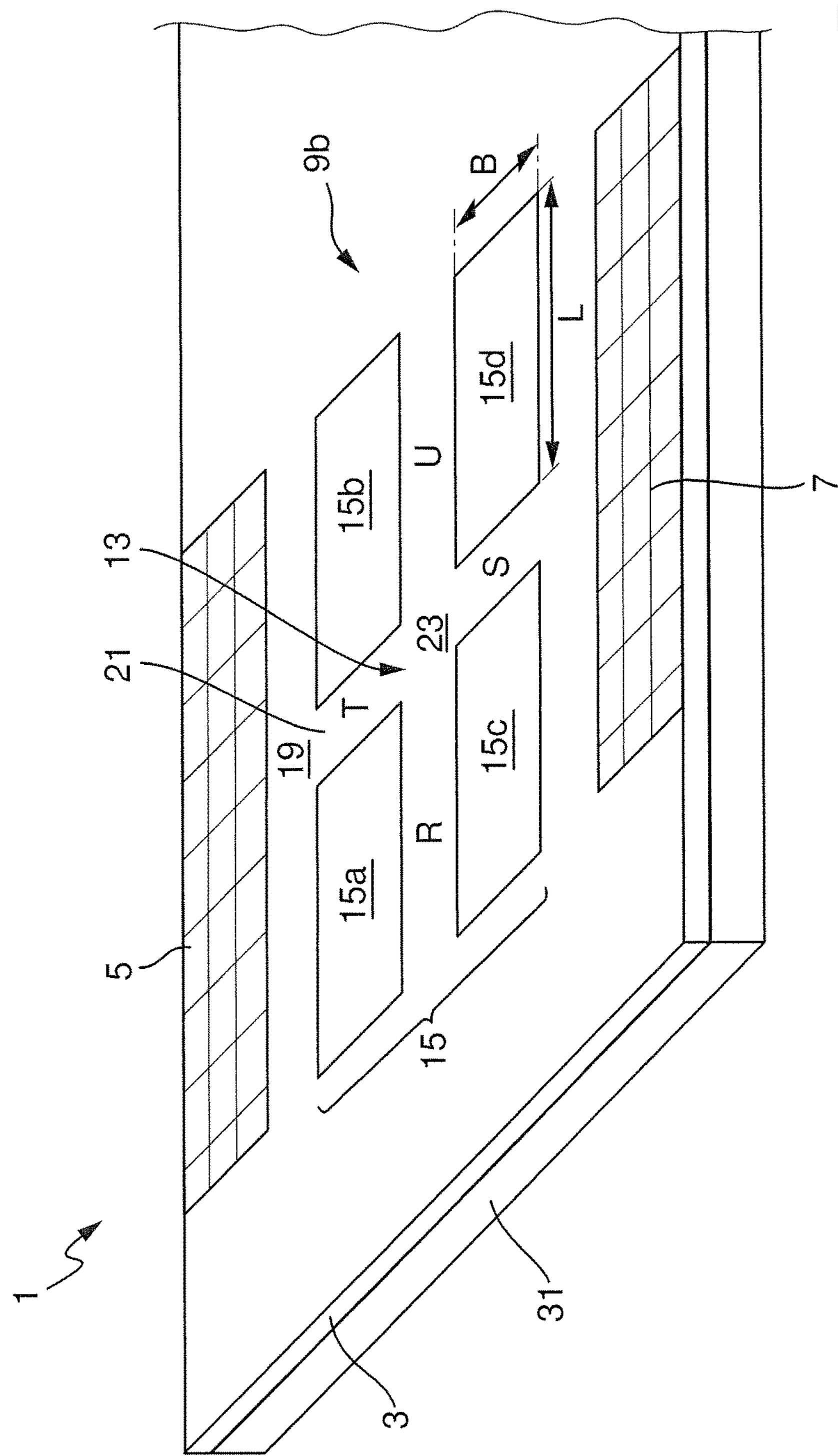
FIG. 2 is a view onto a circuit board having a circuit board ply in which a dielectric wave conductor arrangement is arranged between a high-frequency component and an other component.

FIGS. 1 and 2 each show a view of a circuit board 1, which has a circuit board ply 3, on which are provided a high-frequency component 5 (here only schematically drawn), which, during operation, emits high-frequency electromagnetic interference waves, and at least one other component 7 (here likewise only schematically drawn), especially another high-frequency component.

According to the invention, there is provided between the high-frequency component 5 and the other component 7 at least one dielectric barrier 9*a*, 9*b*, which blocks propagation of high-frequency electromagnetic interference waves between the high-frequency component 5 and the other component 7. In such case, the fact is utilized that dielectric elements decisively influence the forming of high-frequency electromagnetic fields, and, thus, bring about a blocking of the field propagation between the components. Due to the blocking of the field propagation, the transmission of electromagnetic power between the high-frequency component 5 and the other component 7 is prevented, and, thus, a mutual degrading of the two components reduced.

High-frequency electromagnetic waves are capable of propagation both above the circuit board ply 3 as well as also in the circuit board ply 3.

Accordingly, the invention includes a variant having arranged on an upper side of the circuit board ply 3 at least one dielectric barrier 9*a*, which effects a reduction of electromagnetic waves transmitted above the circuit board ply 3, and a second variant having arranged in the circuit board ply 3 at least one dielectric barrier 9*b*, which hinders the propagation of electromagnetic waves within the circuit board ply 3.

FIG. 1 shows a preferred example of an embodiment of the first variant. In the simplest case, the dielectric barriers 9*a* arranged on the circuit board ply 3 are bodies, such as e.g. cubes or cuboids, of a dielectric arranged on the circuit board ply 3.

These are preferably applied on a conductive trace 11, e.g. a copper trace, located between the high-frequency component 5 and the other component 7 on the upper side of the circuit board ply 3. The conductive trace even itself effects a blocking of wave fractions propagating above the circuit board ply 3.

Preferably, instead of simple dielectric bodies; electronic components having a dielectric core, e.g. resistors or capacitors equipped with a dielectric core, are applied as barriers 9*a*. In such case, preferably electronic components are applied, whose core has a high dielectric constant. Moreover, preferably components are applied, which can be applied on the circuit board 1 in a populating method to be performed in any event in the regular populating of the circuit board 1. An example of this are SMD components, which are soldered onto the conductive trace 11.

Additionally preferably provided along the conductive trace 11 are vias P, which connect the conductive trace 11 conductively with a metallizing M, e.g. a copper ply, located under the circuit board ply 3. In such case, sections of the circuit board ply 3 located between two vias act as metal hollow conductors, whose cut-off frequency is adjustable by their dimensioning and the dielectric properties of the circuit board ply 3. Correspondingly, interference signals with frequencies lying under the cut-off frequency are not capable of propagation in the metal hollow conductor.

Figure 3:
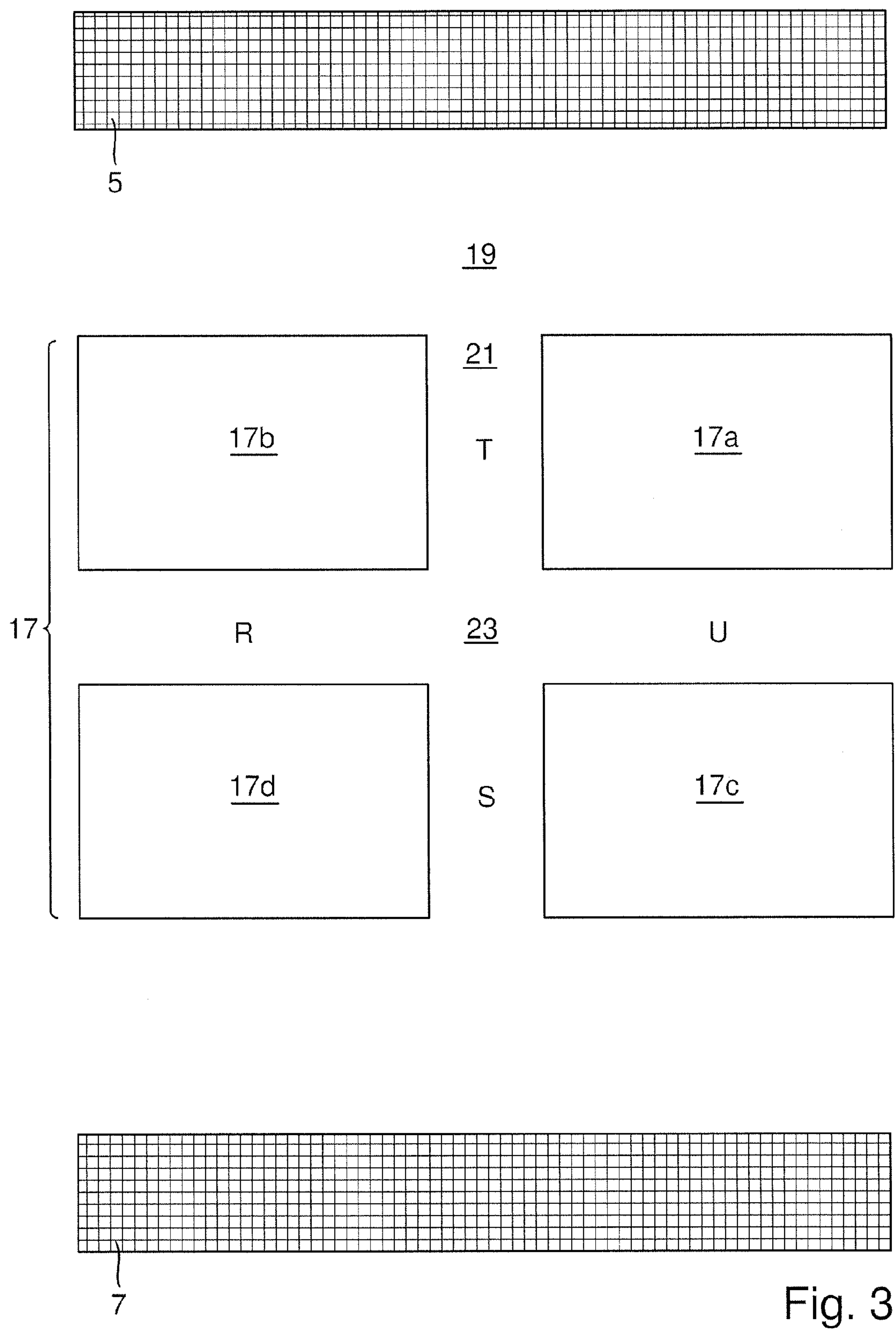
FIG. 3 is a metallizing on an underside of the circuit board ply of FIG. 2.

FIGS. 2 and 3 show an example of an embodiment of the second variant of the invention. The dielectric barrier 9*b* arranged in the circuit board ply 3 includes preferably a wave conductor arrangement 13, which has at least one dielectric wave conductor segment R, S, T, U extending in the circuit board ply 3.

The wave conductor arrangement 13 is preferably formed by applying on the upper side and on an underside of the circuit board ply 3, in each case, a metallizing 15, 17, which has a structuring formed by cutouts in the respective metallizing 15, 17. The structuring comprises slot-line shaped cavities, which, in cooperation with the regions of the circuit board ply 3 enclosed therebetween, form the wave conductor arrangement 13. In such case, the metallizings 15, 17 have on the upper- and the undersides in the region of the dielectric wave conductor segments R, S, T, U equally formed, mutually superimposed, slot-line shaped cutouts, by which the arrangement, geometry and course of the regions of the circuit board ply 3 limited by the metallizing 15, 17 and forming the dielectric wave conductor segments R, S, T, U are predetermined. The corresponding structuring of the metallizing 15 applied on the upper side is shown in the view of FIG. 2. The structuring of the metallizing and 17 applied on the underside of the circuit board ply 3 is shown in FIG. 3.

The applying of structured metallizing is a working step, which is regularly executed in any event in the manufacture of circuit boards 1. Thus, the production of more complex wave conductor arrangements 13 is quite possible cost effectively without an additional working step.

Provided between the high-frequency component 5 and the wave conductor arrangement 13 is preferably a metallizing free region 19, in which no metallizing is applied on the underside of the circuit board ply 3 and preferably also on the upper side of the circuit board ply 3. In this way, it is achieved that this region 19 of the circuit board ply 3 acts as a planar dielectric waveguide, via which electromagnetic waves propagating in the circuit board ply 3 are guided toward the dielectric barrier 9*b*.

Fundamentally, even a single dielectric wave conductor segment R, U extending preferably transversely to the propagation direction of the interference waves effects a blocking of the propagation of electromagnetic waves within the circuit board ply 3, and therewith a reduction of mutual degrading of neighboring components.

In such case, the propagation direction is a direction dependent on the interference wave emission of the components provided on the circuit board 1, respectively in the circuit board 1, in which without measures for interference suppression those interference waves would propagate, which would bring about the greatest or at least one significant degrading of another component. In such case, preferably also the sensitivity of the other components to electromagnetic interferences is taken into consideration. Components emit interference waves usually in all spatial directions or at least with a large aperture angle. Accordingly, the propagation direction is to be understood as a principal direction, in which the emitted interference radiation would exert the greatest negative influence without measures for its suppression.

In the present example, it is assumed that these interference waves of the high-frequency component 5 are emitted, and the other component 7 is sensitive to interference waves. Accordingly, the here relevant propagation direction of the interference waves extends essentially in the direction of an imaginary connecting line between the high-frequency component 5 and the other component 7.

Preferably, the wave conductor arrangement 13 includes, however, not only a single wave conductor segment, but, instead, a system, described subsequently in detail, of a number of dielectric wave conductor segments R, S, T, U connected with one another. Such offers the advantage that the wave conductor system can be embodied in such a manner that therewith not only a blocking of the wave propagation between the two components is effected, but, instead, moreover, also at least a partial canceling of the interference waves can be achieved.

In such case, the wave conductor arrangement 13 includes preferably an input 21 facing the high-frequency component (5), via which interference waves propagating in the circuit board ply 3 enter into the wave conductor system.

The wave conductor system includes connected with one another via an intersection 23 preferably four wave conductor segments R, S, T, U, of which two are connected with one another in a straight line across the intersection 23 and extend transversely to the propagation direction of the interference waves, and two are connected with one another in a straight line across the intersection 23 and extend parallel to the propagation direction of the interference waves. Thus, all four wave conductor segments R, S, T, U meet in the intersection 23.

Input 21 can in the simplest case be formed by the end of the wave conductor segment T facing the high-frequency component 5. This form of embodiment is shown in FIGS. 2 and 3.

Figure 4:
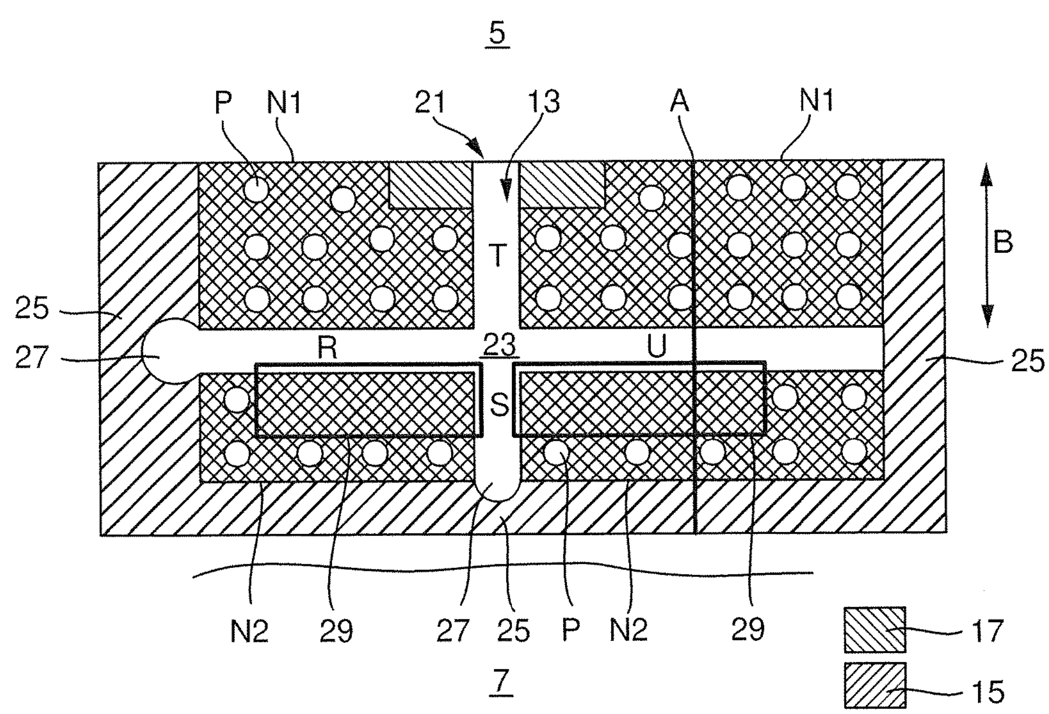
FIG. 4 is a metallizing on an upper side and on an underside of the circuit board ply for a broader banded and widened input equipped variation of the dielectric wave conductor arrangement of FIG. 2.

Preferably, however, an input form is selected, which effects a low reflection transition of the broadside dielectrically guided waves via the metallizing free region 19 into the wave conductor segment T. This is achieved, for example, by broadening of the slot-line shaped cutout of the metallizing 17 applied on the underside of the circuit board ply 3 and forming the waveguide T terminally in the direction of the high-frequency component 5. This can be an abrupt broadening. FIG. 4 shows, for this, the metallizing 15, 17 of a corresponding variation of the circuit board 1 of FIGS. 2 and 3, wherein the two metallizings 15, 17 are shown on top of one another and distinguishable by differently directed cross hatchings.

Alternatively, also another form of broadening, e.g. a funnel or trumpet shaped broadening becoming wider in the direction of the high-frequency component 5, can be provided.

In operation, at least one part of the electromagnetic interference waves emanating from the high-frequency component 5 and propagating in the circuit board ply 3 enters via the input 21 into the wave conductor arrangement 13 and is guided via the waveguide T to the intersection 23, where it is divided into three wave portions propagating in the remaining three wave conductor segments R, S, U. Each of these wave portions is reflected at the end of the respective wave conductor segment R, S, U back to the intersection 23. In such case, at least one part of the reflected wave portions is reflected via the intersection 23 back into the wave conductor segment T. Of this, in turn, at least a part is reflected at the end of the wave conductor segment T, respectively at the input 21, facing the high-frequency component 5 anew back in the direction of the intersection 23.

On the whole, there arises thereby within the wave conductor arrangement 13 a superpositioning of the entering and the reflected wave portions, through which in the case of corresponding frequency matched dimensioning of the lengths of the individual dielectric wave conductor segments R, S, T, U a canceling of a part of the entering power is effected by destructive interference.

The dimensioning for this is established preferably as a function of a predetermined main-frequency of the electromagnetic interference waves emanating from the high-frequency component 5.

In such case, the wave conductor segments R and U extending transversely to the propagation direction have a length, which equals half the wavelength of the interference waves transmitted with the main-frequency into the respective wave conductor segments R, U, and the wave conductor segments S and T extending parallel to propagation direction have, in each case, a length, which equals a fourth of the wavelength of the interference waves transmitted with the main-frequency into the respective wave conductor segments S, T. In this way, especially in the region of the intersection 23, destructive interference is achieved. This is, due to the required frequency dependent dimensioning of the wave conductor arrangement 13, limited to a narrow frequency band surrounding the main-frequency.

In the case of application of a widened input 21, the part reflected at the input side in the wave conductor segment T back in the direction of the intersection 23 is smaller than the part reflected at the ends of the wave conductor segments R, S, U. This is in reference to the desired destructive interference preferably achieved by embodying the wave conductor segments R, U extending transversely to the propagation direction in such a manner that they have a slightly greater impedance than one of the wave conductor segments S, T connected in a straight line with the input 21. In this way, it is effected that via the intersection 23 a slightly larger part is guided into the wave conductor segments S, T. In such case, the impedance difference is usually in the order of magnitude of a few percent, e.g. in the region of 5%.

The metallizing 15, 17 on the upper- and the undersides of the circuit board ply 3 are in the case of the example of an embodiment shown in FIGS. 2 and 3 composed of four mutually spaced rectangular metal surfaces 15*a*, 15*b*, 15*c*, 15*d*, 17*a*, 17*b*, 17*c*, 17*d* whose length L extending perpendicular to the propagation direction corresponds to the length of the wave conductor segments R, respectively U, and whose breadth B corresponds to the length of the wave conductor segments S, respectively T.

Since the individual metal surfaces 15*a*, 15*b*, 15*c*, 15 and 17*a*, 17*b*, 17*c*, 17*d* of the metallizing 15, 17 are spatially isolated from one another, there is a galvanic isolating of the associated circuit board ply regions, which can be utilized for example for explosion protection, for preventing ground loops, or for implementing different reference potentials for the high-frequency component 5 and the other component 7.

In applications in which galvanic isolation is not desired or not required, the individual metal surfaces 17*a*, 17*b*, 17*c*, 17*d* of the metallizing 17 of the circuit board ply 3 are preferably connected conductively with one another by bridges 25. For this, the bridges 25 are applied as areas outside of the wave conductor arrangement 13 on the corresponding sides of the circuit board ply 3. This variation of the circuit board 1 illustrated in FIGS. 2 and 3 is provided in the example of an embodiment shown in FIG. 4 in the case of the metallizing 17 applied on the underside of the circuit board ply 3. The bridges 25 offer the advantage that the individual metal surfaces 17*a*, 17*b*, 17*c*, 17*d* lie thereby at the same potential, and, thus, form a more homogeneous boundary for the elements of the dielectric wave conductor arrangement 13. Fundamentally, such bridges can be provided in the case of each of the metallizings 15, 17. A wave conductor arrangement 13 broader banded as regards the desired destructive interference is, however, achieved by providing only one of the two metallizings 15, 17 applied on the circuit board ply 3 with bridges 25. In such case, as regards broad-bandedness, preferably that metallizing 17 is provided with bridges 25, which on its side facing away from the circuit board ply 3 borders on the layer having the greater dielectric constant. In the illustrated example of an embodiment, that is the metallizing 17 lying against an additional circuit board ply 31 on the underside of the circuit board ply 3, since the circuit board ply 3 forms here the uppermost position of the circuit board 1, over which the surrounding atmosphere is located, which has a smaller dielectric constant than the other circuit board ply 31. In the case of multi-ply circuit boards, in the case of which dielectric wave conductor arrangements are provided in a number of plies, preferably at least one and, at most, every other metallizing is provided with bridges.

The above described occurrence of destructive interference is, due to the required frequency dependent dimensioning of the wave conductor arrangement 13, limited to a narrow frequency band surrounding the main-frequency.

This frequency band is preferably broadened by embodying one of the two wave conductor segments R, U extending transversely to the propagation direction and the wave conductor segment S extending parallel to the propagation direction on the side of the intersection 23 facing away from the high-frequency component 5 in such a manner that they have on their upper side a slightly smaller length than on their underside. This is provided in the example of an embodiment shown in FIG. 4 in the case of the wave conductor segments R and S. For this, the metal surfaces 15*a*, 15*c* bounding the wave conductor segment R have a slightly smaller length than the corresponding length of the metal surfaces 17*a*, 17*c* located therebeneath for the metallizing 17 applied on the underside. In the same way, the metal surfaces 15*c*, 15*d* bounding the wave conductor segment S have a slightly smaller width than the metal surfaces 17*c*, 17*d* located therebeneath for the metallizing 17 applied on the underside.

Moreover, the ends of these two wave conductor segments R, S for additional broadening of the frequency band have on their undersides preferably a circularly shaped termination 27. Also this is shown in FIG. 4. In such case, the underside circular terminations 27 are formed by a corresponding circular cutouts, here arranged within the corresponding two bridges 25, in the metallizing 17 of the underside of the circuit board ply 3.

Besides the blocking and partial destruction of interference waves propagating within the circuit board ply 3, the wave conductor arrangement 13 effects supplementally also a blocking of interference waves propagating on the circuit board ply 3.

In such case, the edge of the metallizing 15 facing the high-frequency component 5 and applied on the upper side of the circuit board ply 3 forms for these interference waves an edge N1, on which a part of these interference waves is reflected. In the same way, in the reverse direction, a part of the interference waves emanating, in given cases, from the other component 7 on the upper side of the circuit board ply 3 and propagating in the direction of the high-frequency component 5 is reflected on the edge N2 of the metallizing 15 located on the upper side and facing the other component 7. In both cases, the relevant edge N1, N2 effects a reduction of the mutual degrading of the two components.

Moreover, electromagnetic fields forming on the upper side of the circuit board ply 3 enter partially over the upper side of the circuit board ply 3 into the wave conductor arrangement 13. Also in this way, the mutual degrading of the two components is reduced. In such case, the part of interference waves entering the wave conductor arrangement 13 in this way depends decisively on the breadth B of the metal surfaces 15*a*, 15*b*, 15*c*, 15*d* adjoining the particular edge N1, N2 and on the wavelength of the interference waves above the circuit board ply 3. These breadths B give at the same time also the lengths of the wave conductor segments T, S extending parallel to the propagation direction. Correspondingly, the breadths B are preferably predetermined in such a manner that the interference suppression—thus, that effected both by interference wave fractions entering from above into the wave conductor arrangement 13 as well as also that effected by destructive interference in the wave conductor arrangement 13—is, as a whole, maximum.

Alternatively, naturally also wave conductor arrangements can be applied, which have wave conducting segments connected with one another, respectively arranged, in other manner.

Preferably, also in the case of this variant of the invention shown in FIG. 4, vias P are provided, via which the metal surfaces 15*a*, 15*b*, 15*c*, 15*d* of the metallizing 15 on the upper side of the circuit board ply 3 are connected conductively with the metal surfaces 17*a*, 17*b*, 17*c*, 17*d* of the metallizing 17 located therebeneath on the underside of the circuit board ply 3. Also here, the respective sections of the circuit board ply 3 located between two vias act as metal hollow conductors, whose cut-off frequency is adjustable by its dimensioning and the dielectric properties of the circuit board ply 3. Correspondingly, interference, signals with frequencies lying below the cut-off frequency are not capable of propagation in the metal hollow conductor.

Figure 5:
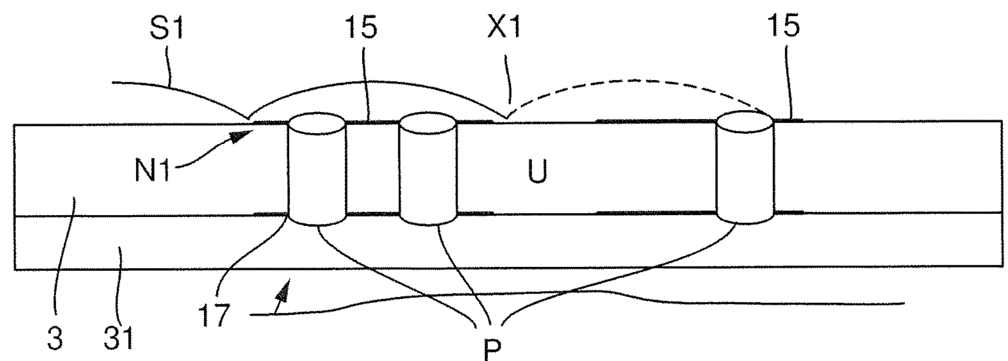
FIG. 5 is a section through a circuit board embodied according to FIG. 4, in combination with an interference wave.
Figure 6:
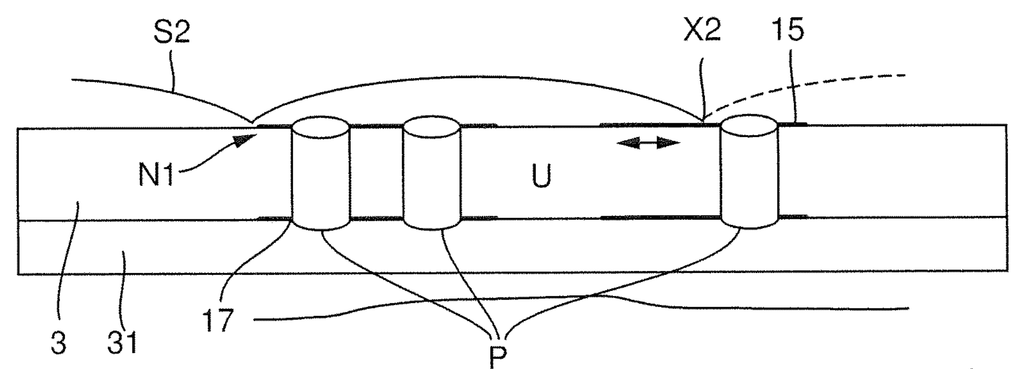
FIG. 6 is a section through a circuit board embodied according to FIG. 4, in combination with another interference wave.

Fundamentally, the vias P can be arranged distributed over the metal surfaces 15*a*, 15*b*, 15*c*, 15*d* of the metallizing 15 of the upper side of the circuit board ply 3, under which on the underside of the circuit board ply 3 one of the metal surfaces 17*a*, 17*b*, 17*c*, 17*d* of the metallizing 17 of the underside of the circuit board ply 3 is located. In such case, however, preferably the regions 29 adjoining the wave conductor segments R and U extending transversely to the propagation direction on their side facing the other component 7 are spared, i.e. in these two regions 29 of the metal surfaces 15*c*, 15*d* preferably no vias P are provided. The via free regions 29 are emphasized in FIG. 4 by thick-lined frames. These regions offer the advantage that thereby the fraction of the interference waves propagating above the circuit board ply 3 and entering into the wave conductor arrangement 13 is increased. This will be explained below based on FIGS. 5 and 6, which show, respectively, a section through the circuit board 1 shown in FIG. 4 taken along a cutting plane A extending parallel to the imaginary connecting line between the high-frequency component 5 and the other component 7 and through the wave conductor segment U. Shown in FIGS. 5 and 6 are, respectively, interference waves S1, S2 traveling above the circuit board ply 3 from the high-frequency component 5 over the edge N1 in the direction of the other component 7. The interference wave S1 shown in FIG. 5 has a higher frequency and therewith a shorter wavelength, then the interference wave S2 shown in FIG. 6. In the two examples, the interference wave S1, S2 strikes a point of impingement X1, X2 on the circuit board ply 3 dependent on its wavelength. If this point of impingement X1 lies, such as shown in FIG. 5, in the region of the wave conductor segment U, then the interference wave S1 enters at least partially into the wave conductor arrangement 13 and so to that extent does not interfere with the other component 7.

If the point of impingement X2 lies, such as shown in FIG. 6, within the region 29, which is free of vias, then a field distribution forms, by which a part of the interference wave S2 is guided back into the wave conductor segment U. This is indicated in FIG. 6 by an arrow. In such case, the part guided back to the wave conductor segment U is larger, the nearer the point of impingement X2 is to the dielectric waveguide U. Interference waves striking in the propagation direction behind the first via P can, however, not be fed back into the dielectric wave conductor arrangement 13.

Also, when the wave conductor arrangement 13 especially via the positioning of the input 21 and the regions 29 free of vias is optimized to reduce transmission of interference waves from the high-frequency component 5 in the direction of the other component 7, then it is effective supplementally also in the reverse direction. I.e. also a transmission of high-frequency interference waves from the other component 7 in the direction of the high-frequency component 5 is blocked by the wave conductor arrangement 13 in the above described manners.

Depending on other constructions of the circuit board 1, respectively desired interference suppression, other wave conductor arrangements 13 can be provided in the circuit board ply 3. The wave conductor arrangements 13 can be arranged distributed e.g. in an orthogonal or hexagonal grid over the circuit board 1 in such a manner that they surround, on almost all sides, one or more components, especially high-frequency components, arranged within a raster field.

In the case of multi-ply circuit boards, the wave conductor arrangements 13 can be arranged both in the uppermost circuit board ply 3 as well as also in one or more inner circuit board plies 3.

Moreover, the two variants of the invention, thus one or more dielectric barriers 9*a* applied above the circuit board ply 3, as well as one or more dielectric barrier 9*b* arranged in the circuit board ply 3, can also be applied in combination with one another, spatially adjoining one another, in one circuit board 1.

In the case of both variants, the circuit board plies 3, on which, respectively in which, dielectric barriers 9*a*, 9*b* are provided, are composed of a material suitable for high-frequency applications, such as e.g. a ceramic. Preferably provided under these circuit board plies 3 is, in each case, another circuit board ply 31, which is composed of a material, which strongly attenuates high-frequency electromagnetic waves. An example of such a material is that known material bearing the material designation FR4 and comprised of epoxy resin soaked glass fiber mats. In this way, supplementally, an interference wave fraction transmitted, in given cases, under the circuit board ply 3 is very much more strongly attenuated than would be the case for circuit board materials preferably used for high-frequency applications.

The interference suppression of the invention resulting from dielectric barriers 9*a*, 9*b* provided on and/or in the circuit board ply 3 includes the advantage that, for producing the dielectric barriers 9*a*, 9*b*, exclusively working steps are required, which are normally applied and used in any event in almost any circuit board manufacturing process. Accordingly, these interference suppression measures can be performed cost effectively. Moreover, dielectric barriers 9*a*, 9*b* are extremely flexible as regards possibly required, future changes of the layout of the circuit board 1, since the barriers 9*a*, 9*b* can be positioned in the context of the manufacturing process almost in any way desired, respectively on or in the circuit board ply 3, corresponding to the requirements of the changed layout.

The invention claimed is:

1. A circuit board comprising:

a circuit board ply, on which is provided a high-frequency component emitting high-frequency electromagnetic interference waves during operation and at least another high frequency component; and there is provided under said circuit board ply another circuit board ply of an epoxy resin soaked, glass fiber mats material attenuating high frequency electromagnetic waves, wherein:

at least one dielectric barrier is provided between said high-frequency component and said another high-frequency component, which blocks propagation of high-frequency electromagnetic interference waves between said high-frequency component and said another high-frequency component;

said at least one dielectric barrier is a dielectric wave conductor arrangement arranged in said circuit board ply;

said wave conductor arrangement includes wave conductor segments connected with one another via an intersection of which:

two are connected with one another in a straight line across an intersection and extend transversely to a propagation direction of the interference waves; and two are connected with one another in a straight line across the intersection and extend parallel to the propagation direction of the interference waves;

interference waves coming during operation into said wave conductor arrangement via wave conductor segments extending parallel to the propagation direction of the interference waves and facing said high-frequency component are divided at the intersection into wave portions propagating in the remaining wave conductor segments;

these wave portions are reflected at ends of the wave conductor segments;

the wave conductor segments have predetermined lengths as a function of a predetermined main-frequency of the reference waves, such that wave portions of entering interference waves of the main-frequency destructively superimpose in said wave conductor arrangement with wave portions reflected at the ends of the wave conductor segments;

the wave conductor segments extending transversely to the propagation direction of the interference waves have a length, which corresponds to a half wavelength of the interference waves having the main-frequency in these wave conductor segments; and the wave conductor segments extending parallel to the propagation direction of the interference waves have a length, which corresponds to a fourth of the wavelength of the interference waves having the main-frequency in these wave conductor segments.

2. The circuit board as claimed in claim 1, wherein: said at least one dielectric barrier is a dielectric body mounted on an upper side of said circuit board ply, especially a dielectric core of a component applied on a metal conductive trace on the upper side of said circuit board ply, especially a component in the form of a resistor or a capacitor.

3. The circuit board as claimed in claim 1, wherein: said dielectric wave conductor arrangement includes at least one wave conductor segment extending transversely to a propagation direction of the interference waves.

4. The circuit board as claimed in claim 1, wherein: said wave conductor arrangement includes facing said high-frequency component an input, which opens into the wave conductor segment facing said high-frequency component and extending parallel to the propagation direction of the interference waves.

5. The circuit board as claimed in claim 1, wherein: said wave conductor arrangement is formed by a region of said circuit board ply, in which:

a metallizing is applied both on an upper side and on an underside of said circuit board ply;

said metallizings have a structuring formed by cutouts in the metallizing; and the structuring in cooperation with the regions of said circuit board ply enclosed therebetween form said wave conductor arrangement.

6. The circuit board as claimed in claim 5, wherein: said metallizings are metal surfaces separated spatially from one another.

7. The circuit board as claimed in claim 5, wherein: the metal surfaces of one of said metallizings, especially the metal surfaces of said metallizing provided on the underside of said circuit board ply, are connected conductively with one another via bridges applied on said circuit board ply outside of said wave conductor arrangement.

8. The circuit board as claimed in claim 4, wherein: said input is formed by cutouts in said metallizing on the underside of said circuit board ply.

9. The circuit board as claimed in claim 5, wherein: vias are provided, which connect the metallizing on the upper side of said circuit board ply conductively with the metallizing located therebeneath on the underside of said circuit board ply.

10. The circuit board as claimed in claim 9, wherein: regions free of the vias are provided on the sides of said wave conductor segments facing said other component and extending transversely to the propagation direction of the interference waves, directly bordering on these wave conductor segments.

11. The circuit board as claimed in claim 5, wherein: a metallizing free region is provided on the underside of said circuit board ply between said high-frequency component and said wave conductor arrangement.

12. A circuit board, comprising:

a circuit board ply, on which is provided a high-frequency component emitting high-frequency electromagnetic interference waves during operation and at least another high frequency component; and there is provided under said circuit board ply another circuit board ply of an epoxy resin soaked, glass fiber mats material attenuating high frequency electromagnetic waves wherein:

at least one dielectric barrier is provided between said high-frequency component and said another high-frequency component, which blocks propagation of high-frequency electromagnetic interference waves between said high-frequency component and said another high-frequency component, wherein:

said at least one dielectric barrier is a dielectric wave conductor arrangement arranged in said circuit board ply, wherein:

said wave conductor arrangement includes wave conductor segments connected with one another via an intersection, of which:

two are connected with one another in a straight line across an intersection and extend transversely to a propagation direction of the interference waves; and two are connected with one another in a straight line across the intersection and extend parallel to the propagation direction of the interference waves;

interference waves coming during operation into said wave conductor arrangement via wave conductor segments extending parallel to the propagation direction of the interference waves and facing said high-frequency component, are divided at the intersection into wave portions propagating in the remaining wave conductor segments;

these wave portions are reflected at ends of the wave conductor segments;

the wave conductor segments have predetermined lengths as a function of a predetermined main-frequency of the interference waves, such that wave portions of entering interference waves of the main-frequency destructively superimpose in said wave conductor arrangement with wave portions reflected at the ends of the wave conductor segments; and the wave conductor segments connected in a straight line with said input have a smaller impedance than the remaining wave conductor segments.

13. A circuit board, comprising: a circuit board ply, on which is provided a high-frequency component emitting high-frequency electromagnetic interference waves during operation and at least another high frequency component; and there is provided under said circuit board ply another circuit board ply of an epoxy resin soaked, glass fiber mats material attenuating high frequency electromagnetic waves, wherein: at least one dielectric barrier is provided between said high-frequency component and said another high-frequency component, which blocks propagation of high-frequency electromagnetic interference waves between said high-frequency component and said another high-frequency component; said at least one dielectric barrier is a dielectric wave conductor arrangement arranged in said circuit board ply; said conductor arrangement includes wave conductor segments connected with one another via an intersection, of which: two are connected with one another in a straight line across an intersection and extend transversely to a propagation direction of the interferences waves; and two are connected with one another in a straight line line across the intersection and extend parallel to the propagation direction of the interference waves; one of the wave conductor segments extending transversely to the propagation direction of the interference waves and the wave conductor segment extending parallel to the propagation direction on the side of the intersection facing away from said high-frequency component are embodied in such a manner that they have a smaller length on their upper side than on their underside; and the wave conductor segment extending transversely to the propagation direction of the interference waves and the wave conductor segment extending parallel to the propagation direction on the side of the intersection facing away from said high-frequency component have on their underside, in each case, circularly shaped termination.

* * * * *